(12) United States Patent
Ikeda et al.

(10) Patent No.: US 9,660,222 B2
(45) Date of Patent: May 23, 2017

(54) LIGHT-EMITTING DEVICE AND METHOD FOR MANUFACTURING THE SAME

(71) Applicants: Semiconductor Energy Laboratory Co., Ltd., Kanagawa-ken (JP); Sharp Kabushiki Kaisha, Osaka (JP)

(72) Inventors: Hisao Ikeda, Kanagawa (JP); Manabu Niboshi, Osaka (JP); Yuto Tsukamoto, Osaka (JP)

(73) Assignees: Semiconductor Energy Laboratory Co., Ltd. (JP); Sharp Kabushiki Kaisha (JP)

(*) Notice: Subject to any disclaimer, the term of this patent is extended or adjusted under 35 U.S.C. 154(b) by 212 days.

(21) Appl. No.: 14/102,857

(22) Filed: Dec. 11, 2013

(65) Prior Publication Data

US 2014/0159017 A1    Jun. 12, 2014

(30) Foreign Application Priority Data

Dec. 12, 2012 (JP) .................. 2012-271152

(51) Int. Cl.
*H01L 51/52* (2006.01)
*H05B 33/04* (2006.01)
*H01L 23/29* (2006.01)

(52) U.S. Cl.
CPC .......... *H01L 51/529* (2013.01); *H01L 51/524* (2013.01); *H05B 33/04* (2013.01); *H01L 23/29* (2013.01)

(58) Field of Classification Search
CPC ......... H01L 21/54; H01L 23/29; H01L 27/32; H01L 51/5237; H01L 51/524; H01L 51/525; H01L 51/529
See application file for complete search history.

(56) References Cited

U.S. PATENT DOCUMENTS

| 5,239,228 A | 8/1993 | Taniguchi et al. |
| 5,783,464 A | 7/1998 | Burns |
| 6,114,805 A | 9/2000 | Codama et al. |

(Continued)

FOREIGN PATENT DOCUMENTS

| CN | 001411323 A | 4/2003 |
| CN | 101009362 A | 8/2007 |

(Continued)

OTHER PUBLICATIONS

Othman, SH, et al. Dispersion and stabilization of photocatalytic $TiO_2$ nanoparticles in aqueous suspension for coatings applications. J. Nanomaterials, 2012 (2012) 718214.*

(Continued)

*Primary Examiner* — Thao X Le
*Assistant Examiner* — Gardner W Swan
(74) *Attorney, Agent, or Firm* — Husch Blackwell LLP

(57) ABSTRACT

A light-emitting device with high reliability is provided. A light-emitting device includes a substrate 101, an organic EL element 110 formed over the substrate, a counter substrate 102 which is disposed so as to face the substrate, a plurality of projection structures 102a which are formed on the counter substrate and face the organic EL element, and a thermal conductor 135a of a liquid, a solid, or the like, which is disposed between the substrate and the counter substrate. The plurality of projection structures and the organic EL element are each in contact with the thermal conductor.

7 Claims, 5 Drawing Sheets

(56) References Cited

U.S. PATENT DOCUMENTS

| | | | |
|---|---|---|---|
| 6,117,529 | A | 9/2000 | Leising et al. |
| 6,221,543 | B1 | 4/2001 | Guehler et al. |
| 6,250,765 | B1 | 6/2001 | Murakami |
| 6,284,342 | B1 | 9/2001 | Ebisawa et al. |
| 6,387,737 | B1 | 5/2002 | Yamazaki et al. |
| 6,440,877 | B1 | 8/2002 | Yamazaki et al. |
| 6,476,783 | B2 | 11/2002 | Matthies et al. |
| 6,537,688 | B2 | 3/2003 | Silvernail et al. |
| 6,601,962 | B1 | 8/2003 | Ehara et al. |
| 6,724,150 | B2 | 4/2004 | Maruyama et al. |
| 6,737,176 | B1 | 5/2004 | Otsuki et al. |
| 7,097,527 | B2 | 8/2006 | Matsuoka |
| 8,890,394 | B2 | 11/2014 | Mima |
| 2003/0067268 | A1* | 4/2003 | Matsuoka ............ H01L 51/5237 313/512 |
| 2004/0191566 | A1* | 9/2004 | Kikuchi ................ H01L 51/529 428/690 |
| 2004/0227703 | A1* | 11/2004 | Lamvik .............. G02B 27/0172 345/76 |
| 2005/0184652 | A1 | 8/2005 | Maruyama et al. |
| 2007/0075625 | A1* | 4/2007 | Yuki ....................... C09K 11/06 313/496 |
| 2007/0096088 | A1* | 5/2007 | Tano .................. H01L 51/0533 257/40 |
| 2007/0200492 | A1* | 8/2007 | Cok ...................... H01L 27/322 313/506 |
| 2012/0244643 | A1* | 9/2012 | Yamazaki ............ H01L 51/5212 438/4 |
| 2012/0293058 | A1* | 11/2012 | Mima .................... H01L 51/524 313/46 |
| 2014/0232258 | A1* | 8/2014 | Oh ....................... H01L 51/5259 313/504 |

FOREIGN PATENT DOCUMENTS

| | | |
|---|---|---|
| CN | 102726121 A | 10/2012 |
| EP | 2 531 004 A1 | 12/2012 |
| JP | 2003-22891 | 1/2003 |
| JP | 2006-179218 | 7/2006 |
| JP | 2011-154800 A | 8/2011 |
| JP | 2011-204645 | 10/2011 |
| KR | 2012-0127428 A | 11/2012 |
| TW | 201131852 | 9/2011 |
| WO | WO 2011/093125 A1 | 8/2011 |

OTHER PUBLICATIONS

Vanderbilt Minerals Technical Data. DARVAN C-N Dispersing Agent. obtained from http://www.vanderbiltminerals.com/ee_content/Documents/Technical/TDS_DARVAN_C-N_Web.pdf.*

Kim, G. H. et al. Longevity of plastic-based organic light-emitting devices by means of protective oils as passivation layer. Jpn. J. Appl. Phys. 44 (2005) L1094-L1096.*

Chinese Office Action re Application No. CN 201310681327.5, dated Aug. 22, 2016.

* cited by examiner

LIGHT-EMITTING DEVICE AND METHOD FOR MANUFACTURING THE SAME

BACKGROUND OF THE INVENTION

1. Field of the Invention

The present invention relates to a light-emitting device, a lighting device, a display device, and a semiconductor device. In particular, the present invention relates to a light-emitting device having an organic EL element and a manufacturing method thereof.

2. Description of the Related Art

An organic EL element which is a light-emitting element in which a layer containing a light-emitting organic compound is provided between a pair of electrodes (e.g., an upper electrode and a lower electrode) is known. The layer containing a light-emitting organic compound has an extremely small thickness, which is greater than or equal to several tens of nanometers and less than several hundreds of nanometers, and breaks down easily.

Although the organic EL element emits light by causing current to flow therethrough, Joule heat is caused depending on current flowing through the element. In some cases, the Joule heat damages the layer containing a light-emitting organic compound and reduces the reliability of the organic EL element.

Further, a lighting device including organic EL elements, in which, in general, a plurality of organic EL elements which are connected in series are driven by a constant current, entirely emits no light if there is a short circuit in one of the organic EL elements. The short circuit is probably caused due to dusts, an unevenness of a lower electrode, or the like. A short circuit may occur even in a place where a short circuit has not caused yet in an initial state while an organic EL element is driven to convert current into light. Its mechanism will be described below.

(1) In some places, bright light is emitted because a large amount of current flows through part of the organic EL element due to a dust or an unevenness of the lower electrode which is slight enough not to cause a short circuit. Such a place is referred to as a luminescent spot.

(2) Since a larger amount of current flows through the luminescent spot than other places, heat generated in the luminescent spot due to Joule heat is higher than that in other places. Therefore, the temperature of the luminescent spot gradually rises if heat is insufficiently diffused throughout a light-emitting device from the luminescent spot.

(3) The electric resistance of the organic EL element gets lower as the temperature rises; accordingly, a much larger amount of current flows through the luminescent spot if the electric resistance of the luminescent spot is decreased due to generation of heat.

When the temperature of the layer containing a light-emitting organic compound in a luminescent spot rises to a temperature that cannot be withstood due to repetition of the above (2) and (3), the layer containing a light-emitting organic compound is broken down and the pair of electrodes is short-circuited.

In the lighting device including organic EL elements, a technique of dissipating heat is extremely important to cut off such a vicious cycle. Particularly in the case of a bottom-emission lighting device in which light is extracted to a substrate side on which an organic EL element is provided, it is important to efficiently dissipate heat generated by the organic EL element to a wall or a ceiling which easily diffuses heat through a counter substrate because the counter substrate is provided in contact with the wall or the ceiling.

Thus, a first light-emitting device, a second light-emitting device, and a third light-emitting device are known which efficiently dissipate heat generated by an organic EL element so that deterioration of characteristics of the organic EL element due to the generation of heat can be arrested.

The first light-emitting device includes an element substrate over which an organic EL element is formed, a counter substrate being adhered to the element substrate and forming a sealed space with the element substrate, and a thermal conductor being provided in the sealed space and conducting heat of the organic EL element to the counter substrate, and an inert liquid is used for the thermal conductor (see Patent Document 1).

In the above first light-emitting device, a short circuit is sometimes caused because a dust or the like attached to a cathode is crashed by the thermal conductor in sealing the thermal conductor between the element substrate and the counter substrate which are attached to each other using a drop-filling device. This is because, in a general drop-filling device, a pressure is applied to the element substrate and the counter substrate at their attachment so that the thermal conductor for filling is spread out uniformly.

The following measures can be considered not to apply a pressure at the attachment: a space for the thermal conductor is provided on the counter substrate side and sealing is performed with the space filled with a less amount of the thermal conductor than the capacity of the space. Accordingly, the pressure applied to the cathode at the sealing can be almost eliminated.

However, with the above measures, a region filled with a gas having low thermal conductance is formed widely in a space between the counter substrate and the thermal conductor; therefore, thermal diffusivity is drastically decreased at the center or the like of the counter substrate. In the case where the thermal conductor is a liquid, this occurs when a light-emitting device is attached to a ceiling or the like so that the element substrate faces downward. Even in the case where the thermal conductor is a solid, the thermal conductor might be solidified so that the region filled with a gas having low thermal conductance is formed widely in the space between the counter substrate and the thermal conductor. When the counter substrate is made to face downward and solidified, a region filled with a gas is formed widely in a space between the cathode and the thermal conductor.

The second light-emitting device includes, as a thermal conductor, an inert liquid between a sealing member and an organic EL element, and an uneven structure portion, which makes a heat dissipation area larger than when a surface of an element substrate is flat, is provided on the surface side of the element substrate, which is opposite to a light-emitting layer side of a cathode (see Patent Document 2).

The third light-emitting device has a structure in which heat generated by an organic EL element is dissipated to a projected heat dissipation portion which is provided in contact with the organic EL element (see Patent Document 3). However, when there is a material having low thermal conductance (e.g., a gas such as air) between the heat dissipation portion and the organic EL element or between the heat dissipation portion and a sealing substrate, heat generated by the organic EL element is not dissipated efficiently. Thus, a structure in which the heat dissipation portion is provided so as to be in contact with the organic EL element and is pressed to the sealing substrate to be in close contact with each other is known (see Patent Document 3).

However, when a foreign substance unintentionally is mixed into a space between the projected heat dissipation portion and the organic EL element or between the heat dissipation portion and the sealing substrate, the pressure applied to press the heat dissipation portion to the organic EL element is concentrated in a portion of the organic EL element where the foreign substance exists. As a result, electrodes in a pair might be in contact with each other and are short-circuited. Alternatively, the thickness of a layer containing a light-emitting organic compound gets locally smaller, which sometimes causes abnormal heat generation to such a thin portion due to a large amount of current flow. When locally heated, the layer containing a light-emitting organic compound is broken down due to the heat and thus the pair of electrodes is short-circuited in some cases. When the pair of electrodes of the organic EL element is short-circuited, current concentrates on the short-circuited portion and damages the organic EL element. Further, fire or the like might be caused.

The concentration of pressure can be probably prevented in such a manner that a space between the above-described projected heat dissipation portion and organic EL element is filled with a thermal conductor having fluidity so that the thermal conductor is deformed in accordance with the shape of the foreign substance.

Note that in the case where the thermal conductor has fluidity, a bubble that is mixed when the space is filled with the thermal conductor can move freely. Thus, in some cases, the bubble can enter a space between the heat dissipation portion and the organic EL element and accordingly heat conduction to the heat dissipation portion from the organic EL element is obstructed.

It is natural that consideration not to allow mixture of a foreign substance be taken in a manufacturing process of a light-emitting device including an organic EL element; however, it is difficult to eliminate the mixture of a foreign substance. It is also difficult to fill the space with a thermal conductor having fluidity with a bubble prevented from being mixed and without being overflowed.

REFERENCE

Patent Document

[Patent Document 1] Japanese Published Patent Application No. 2006-179218
[Patent Document 2] Japanese Published Patent Application No. 2011-204645
[Patent Document 2] Japanese Published Patent Application No. 2011-022891

SUMMARY OF THE INVENTION

One object of one embodiment of the present invention is to provide a light-emitting device with high reliability. Another object of one embodiment of the present invention is to provide a light-emitting device with high productivity. Another object of one embodiment of the present invention is to provide a method for manufacturing a light-emitting device in which a decrease in the yield due to mixture of a foreign substance at production is less likely to occur.

One embodiment of the present invention has been made with a focus on an organic EL element which is sealed between a substrate and a heat dissipation member, a thermal conductor having fluidity, and an inert gas.

One embodiment of the present invention is a light-emitting device including a substrate, an organic EL element formed over the substrate, a counter substrate which is disposed so as to face the substrate, a plurality of projection structures which are formed on the counter substrate and face the organic EL element, and a liquid or a solid which is disposed between the substrate and the counter substrate. The plurality of projection structures and the organic EL element are each in contact with the liquid or the solid.

In the above one embodiment of the present invention described above, an inert gas in contact with each depression structure formed between the plurality of projection structures is preferably included.

In the one embodiment of the present invention described above, the plurality of projection structures are preferably integrated with the counter substrate.

In the one embodiment of the present invention described above, the plurality of projection structures are preferably attached to the counter substrate.

In the one embodiment of the present invention described above, the density of the plurality of projection structures in a central portion of the counter substrate is preferably higher than the density of the plurality of projection structures in a peripheral portion of the counter substrate.

In the one embodiment of the present invention described above, each distance between the plurality of projection structures is preferably greater than or equal to 100 µm and less than or equal to 500 µm.

In the one embodiment of the present invention described above, a specific gravity of the liquid is preferably higher than a specific gravity of water.

In the one embodiment of the present invention described above, it is preferable that the liquid include a first liquid having a first specific gravity and a second liquid having a second specific gravity lower than the first specific gravity, the first liquid be more hydrophobic than the second liquid, and the second liquid capture water.

Another embodiment of the present invention is a method for manufacturing a light-emitting device including the steps of preparing a substrate over which an organic EL element is formed and a counter substrate having a plurality of depression structures and a plurality of projection structures; disposing the substrate and the counter substrate so that the plurality of depression structures and the plurality of projection structures face the organic EL element, and the organic EL element, the plurality of depression structures, and the plurality of projection structures are covered with a liquid or a solid, and an inert gas; and sealing the organic EL element, the liquid or the solid, and the inert gas between the substrate and the counter substrate by applying a pressure to the substrate and the counter substrate.

By applying one embodiment of the present invention, a light-emitting device with high reliability can be provided. By applying one embodiment of the present invention, a light-emitting device with high productivity can be provided. By applying one embodiment of the present invention, it is possible to provide a method for manufacturing a light-emitting device in which a decrease in the yield due to mixture of a foreign substance at production is less likely to occur.

DETAILED DESCRIPTION OF THE INVENTION

Embodiments of the present invention will be described in detail below with reference to drawings. Note that the present invention is not limited to the description below, and it is easily understood by those skilled in the art that a variety of changes and modifications can be made without departing from the spirit and scope of the present invention. Therefore, the invention should not be construed as being limited to the description in the following embodiments.

[Embodiment 1]

Figure 1A:
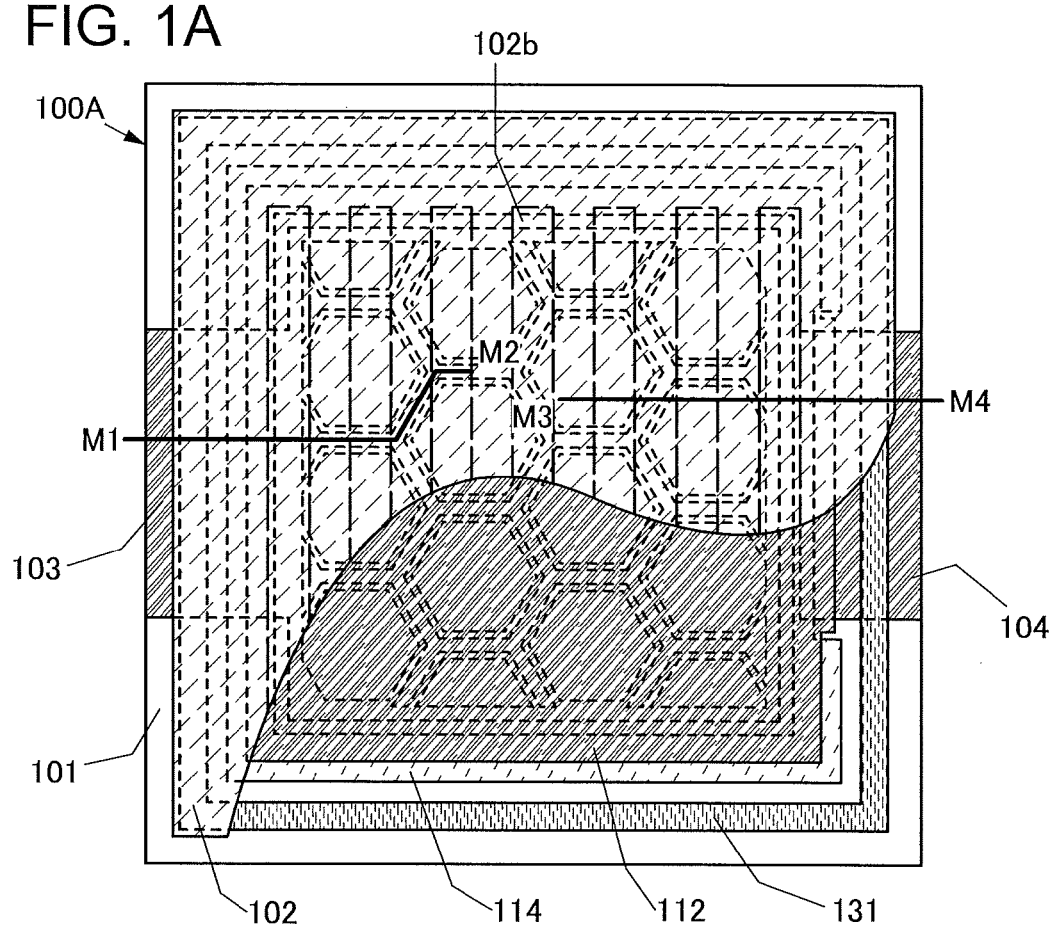
FIG. 1A is a plan view illustrating a light-emitting device 100A of one embodiment of the present invention.
Figure 1B:
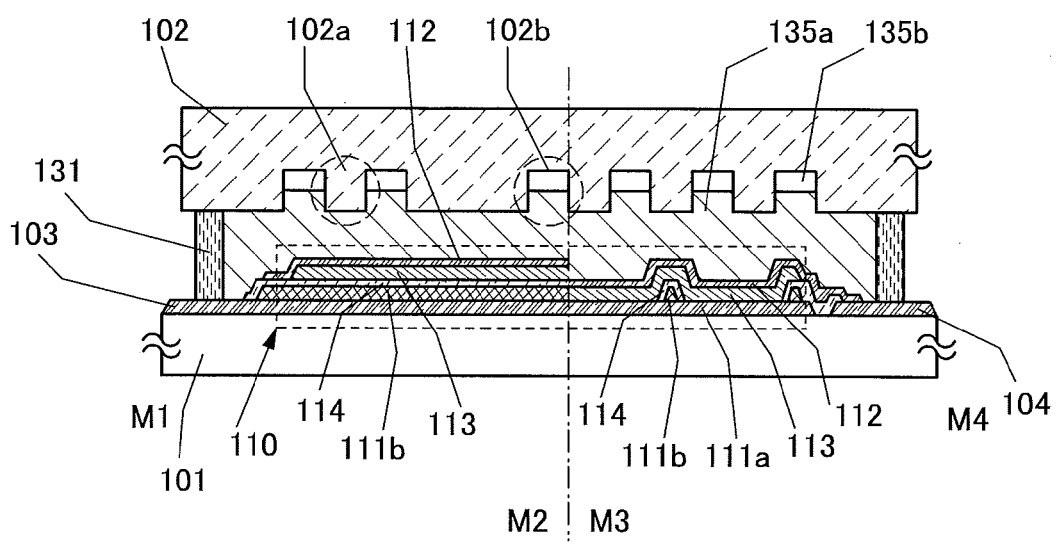
FIG. 1B is a cross-sectional view taken along line M1-M2 and line M3-M4 of FIG. 1A.

FIG. 1A is a plan view illustrating a light-emitting device 100A of one embodiment of the present invention, and FIG. 1B is a cross-sectional view taken along line M1-M2 and line M3-M4 of FIG. 1A. The light-emitting device 100A described in this embodiment as an example has a bottom-emission structure, where lights emitted from light-emitting elements are extracted from a substrate side on which the light-emitting elements are formed.

The light-emitting device 100A includes an organic EL element 110 which is a light-emitting element, a thermal conductor 135a, and an inert gas 135b between a substrate 101 and a counter substrate 102. The organic EL element 110 includes a first electrode 111a, a layer 113 containing a light-emitting organic compound, and a second electrode 112. The thermal conductor 135a may be either a liquid or a solid, or may be a fluid having fluidity in which a liquid and a solid are mixed.

A first terminal 103 and a second terminal 104 are formed over the substrate 101. The first terminal 103 is electrically connected to the first electrode 111a formed over the substrate 101. The first electrode 111a is electrically isolated from the second terminal 104 by a partition wall 114.

The layer 113 containing a light-emitting organic compound and an auxiliary wiring 111b are formed over the first electrode 111a, and the layer 113 containing a light-emitting organic compound is electrically isolated from the auxiliary wiring 111b by a partition wall 114. When seen from the above, the partition wall 114 and the auxiliary wiring 111b are disposed along peripheries of hexagons (see FIG. 1A). The second electrode 112 is formed over the layer 113 containing a light-emitting organic compound, and the second electrode 112 is electrically connected to the second terminal 104.

In this manner, the organic EL element 110 is formed over the substrate 101, and the counter substrate 102 is disposed over the organic EL element 110. A plurality of depression structures 102b and a plurality of projection structures 102a are formed on the bottom surface of the counter substrate 102, and the plurality of depression structures 102b and the plurality of projection structures 102a are formed as part of the counter substrate 102. The plurality of depression structures 102b are formed by providing a plurality of grooves on the bottom surface of the counter substrate 102, which are parallel to each other (see FIG. 1A). The plurality of projection structures 102a are each formed between the plurality of depression structures 102b and are formed by formation of the plurality of depression structures 102b.

The organic EL element 110, the thermal conductor 135a, and the inert gas 135b are sealed between the substrate 101 and the counter substrate 102 by a sealant 131 surrounding the periphery of the organic EL element 110. The thermal conductor 135a is in contact with the projection structures 102a of the counter substrate 102 and the second electrode 112 of the organic EL element 110. The inert gas 135b is in contact with the depression structure 102b of the counter substrate 102.

According to this embodiment, the thermal conductor 135a is in contact with the projection structures 102a of the counter substrate 102 and the second electrode 112 of the organic EL element 110, so that a contact area between the counter substrate 102 and the thermal conductor 135a gets larger and accordingly heat generated by the organic EL element 110 can be efficiently dissipated to the counter substrate 102 through the thermal conductor 135a and the projection structures 102a. As a result, deterioration of characteristics of the organic EL element due to the generation of heat can be arrested, so that the reliability of the light-emitting device 100A can be improved.

Note that although not illustrated, a pathway for joining the plurality of depression structures may be provided. With this pathway for joining depression structures, it is possible to prevent obstruction of heat conduction, which is caused by heat accumulation at a particular place that occurs when a particular depression structure is filled only with an inert gas. Accordingly, all of the depression structures are uniformly filled with the thermal conductor and heat can be dissipated uniformly.

In this embodiment, the plurality of projection structures 102a and the plurality of depression structures 102b are almost equivalent to each other in density of the bottom surface of the counter substrate 102.

It is preferable that the plurality of projection structures 102a be each separated by a distance of greater than or equal to 100 μm and less than or equal to 500 μm and the plurality of depression structures 102b be each separated by a distance of greater than or equal to 100 μm and less than or equal to 500 μm. When the distance is set to be greater than or equal to 100 μm, the depression structures 102b can be easily filled with the inert gas 135b. Further, when the distance is set to be less than or equal to 500 μm, thermal diffusion from the projection structures 102a can be increased.

Next, a method for manufacturing the above light-emitting device 100A is described. The substrate 101 over which the organic EL element 110 is formed, the sealant 131, and the counter substrate 102 including the plurality of projection structures 102a and the plurality of depression structures 102b, which are illustrated in FIGS. 1A and 1B, are prepared. Note that the sealant 131 is provided on the counter substrate 102 so as to surround the organic EL element 110 in an overlapping manner with the substrate 101. Although, here, an example in which the light-emitting device 100A is manufactured in a manner where the substrate 101 facing downward is disposed over the counter substrate 102 facing upward is described, the position of the substrates is not limited to such a position.

The thermal conductor 135a is first dropped on the inner side of the sealant 131 provided on the counter substrate 102, and then the face of the substrate 101 provided with the organic EL element 110 and the face of the counter substrate 102 provided with the plurality of projection structures 102a and the plurality of depression structures 102b are disposed so as to face each other. Then, the substrate 101 is pressed to the counter substrate 102, so that the organic EL element 110, the thermal conductor 135a, and the inert gas 135b are sealed in a region surrounded with the substrate 101, the counter substrate 102, and the sealant 131.

At this time, when the volume of the dropped thermal conductor 135a is larger than the capacity of the region surrounded with the substrate 101, the counter substrate 102, and the sealant 131, a pressure is applied to the organic EL element from the thermal conductor by pressing the substrate 101 to the counter substrate 102. Here, if a dust is mixed in the organic EL element during the manufacturing process, the dust is pushed into the organic EL element by this pressure and a pair of electrodes is short-circuited in some cases.

Thus, the volume of the dropped then thermal conductor 135a is made smaller than the capacity of the region surrounded with the substrate 101, the counter substrate 102, and the sealant 131 so that the thermal conductor 135a is sealed in an inert gas atmosphere. With the structure in which the thermal conductor 135a and the inert gas 135b are sealed together, the inert gas can relieve a pressure that is generated at pressing and thus can prevent a defect due to a dust, which is mixed during the manufacturing process by the pressure, from being pushed into the organic EL element. The light-emitting device 100A is manufactured in this manner.

According to the above manufacturing method, when the substrate 101 and the counter substrate 102 are pressed after the substrate 101 and the counter substrate 102 are disposed so as to face each other, a pressure is relieved by the inert gas 135b that exists between the substrate 101 and the counter substrate; accordingly, a pressure applied to the second electrode 112 is reduced. Thus, even when a foreign substance is mixed in a surface of the organic EL element 110 or in a vicinity thereof, occurrence of a short circuit between the second electrode 112 and the first electrode 111a can be reduced, and damage to the layer containing a light-emitting organic compound can be reduced. That is, protection of the layer containing a light-emitting organic compound from damage makes it possible to reduce occurrence of a short circuit during conversion of current into light by driving the organic EL element 110. Therefore, a method for manufacturing a light-emitting device in which a decrease in the yield due to mixture of a foreign substance at production is less likely to occur can be achieved. Thus, light-emitting devices can be manufactured with improved productivity.

Further, even when the inert gas 135b having lower thermal conductance than the thermal conductor 135a exists between the substrate 101 and the counter substrate, the inert gas 135b placed in the depression structures 102b of the counter substrate 102 can reduce a decrease in heat dissipation efficiency of the counter substrate 102. Therefore, the reliability of the light-emitting device 100A can be improved.

Components of the light-emitting device 100A are described below.

As the substrate 101, a substrate that can transmit visible light can be used because light is extracted from the substrate side. A material of the substrate can be selected as appropriate from glass, plastic, and the like; alternatively, a flexible material can be used.

As the counter substrate 102, for example, a counterbored glass provided with a depression and a projection on its bottom surface, a resin, or a metal plate having high thermal conductance, which is provided with a depression and a projection by pressing may be used. When the metal plate having high thermal conductance is used as the counter substrate 102, heat generated by the organic EL element 110 can be efficiently dissipated to a ceiling or the like which is in contact with the counter substrate 102. Alternatively, a resin having high processability or a plastic material can be used. When the resin is used as the counter substrate 102, it is stacked with a material that lowers moisture permeability. As the material that lowers moisture permeability, for example, a glass substrate and a film of an inorganic material (e.g., a thin film of a metal or the like in addition to a silicon oxide film or a silicon nitride film) can be given.

Since the thermal conductor 135a covers the organic EL element 110, a material that does not contain moisture in any form of a liquid, a solid, and a fluid is preferably used and a hydrophobic material is appropriate. When a liquid thermal conductor is used as the thermal conductor 135a, a liquid whose specific gravity is higher than that of water is preferably used. Accordingly, in the case where the organic EL element 110 is disposed on the lower side as illustrated in FIG. 1B, water which enters through the thermal conductor 135a can be distanced from the organic EL element 110 side.

Further, in the case where a liquid thermal conductor is used as the thermal conductor 135a, a material including two kinds of liquid which are different in specific gravity and are not mixed may be used. In that case, the following combination is appropriate: a first liquid which is hydrophobic and has a higher specific gravity and a second liquid which has specific gravity lower than that of the first liquid and captures water. That is, a thermal conductor is used which contains a first liquid having a first specific gravity and a second liquid having a second specific gravity lower than the first specific gravity, where the first liquid is more hydrophobic than the second liquid and the second liquid captures water. Alternatively, water may be actively captured in such a manner that a drying agent is added to or dispersed in the second liquid. As the drying agent, a porous material such as zeolite, or calcium oxide or barium oxide that adsorbs moisture by chemical reaction can be used.

In the case where the light-emitting device 100A including the thermal conductor 135a which solidifies is attached to a ceiling or the like to be used, the thermal conductor 135a may be solidified as illustrated in FIG. 1B, and even in the case of using the liquid thermal conductor 135a, the state of the thermal conductor 135a in FIG. 1B is obtained by gravity. Alternatively, when a material that solidifies is used for the thermal conductor 135a in the case where a light-emitting device is propped, it may be solidified as illustrated in FIG. 1B.

Specifically, as the thermal conductor 135a, a material having thermal fusibility or a material that solidifies by heat or light can be used. In solidification, a material whose shrinkage ratio (change in size between before and after solidification) is about 1 is preferably used because when the shrinkage ratio is high, a warp might be generated in a panel. Further, a material from which degassing does not occur in solidification is desirable. Specifically, wax, an epoxy-based resin, an acrylic-based resin, or the like can be used. Moreover, a liquid that does not damage the light-emitting element can be used as the thermal conductor. Specifically, a silicon oil, a fluorine-based inactive liquid, or the like can be used.

As the inert gas 135b, a gas containing an element belonging to Group 18 of the periodic table, such as helium, neon, or argon, or nitrogen which is more inexpensive may be used. Also in order to reduce as much as possible the moisture amount of the sealed space, the dew point of the inert gas is preferably lower than or equal to −70° C., further preferably lower than or equal to −80° C. Note that the oxygen concentration is desirably lower than or equal to 1 ppm.

The minimum amount of the inert gas is desirably at least the amount of the inert gas with which one depression structure 102b can be filled. When at least one depression structure 102b is filled with the inert gas, the pressure applied in pressing at the time of sealing can be entirely relieved.

The maximum amount of the inert gas 135b is desirably the amount which does not exceed the capacity of the depression structures 102b. When the inert gas 135b contains up to the amount exceeding the capacity of the depression structures 102b, the compression of the inert gas 135b at the time of sealing gets higher; thus, a higher pressure needs for the attachment. Note that the volume of the inert gas 135b changes depending on the pressure; therefore it is difficult to perform attachment with uniform force while suppressing bend of the substrate. Accordingly, for example, the substrate 101 or the counter substrate 102 is inwardly bent in some cases. As a result, the counter substrate 102 is in contact with the organic EL element 110 resulting in a short circuit between the second electrode 112 and the first electrode 111a or damage of the layer containing a light-emitting organic compound in some cases. Further, when the amount of the inert gas 135b is made not to exceed the capacity of the depression structures 102b, the thermal conductor 135a is surely in contact with the projection structures 102a and heat generated by the organic EL element 110 can be dissipated.

The organic EL element 110 emits light as follows. When a voltage higher than a threshold voltage of the organic EL element 110 is applied between the first electrode (e.g., an anode) 111a and the second electrode (e.g., a cathode) 112, holes are injected to the layer 113 containing a light-emitting organic compound from the anode side through a hole injection layer and a hole transport layer, electrons are injected to the layer 113 containing a light-emitting organic compound from the cathode side through an electron injection layer and an electron transport layer, and the injected holes and electrons are recombined in the layer 113 containing a light-emitting organic compound, whereby the light-emitting organic compound contained in the layer 113 containing a light-emitting organic compound emits light.

Note that the hole transport layer is not necessarily provided as long as the hole injection layer can serve also as the hole transport layer. Also the electron transport layer is not necessarily provided as long as the electron injection layer cam serve also as the electron transport layer.

The first electrode 111a is formed using a light-transmitting conductive film in order to extract light emitted from the light-emitting organic compound. Specifically, a conductive film including indium tin oxide (ITO) or indium zinc oxide can be used. Further, a metal film which is thin enough to have a light-transmitting property can be used. Specifically, a film of silver, an alloy containing silver, or the like having a thickness of greater than or equal to 5 nm and less than 30 nm can be used.

The second electrode 112 is formed using a reflective metal film. In particular, a metal having high reflectivity is preferable because light attenuation hardly occurs. Specifically, silver, aluminum, or an alloy containing silver and/or aluminum is preferable.

The first terminal 103 is formed using a conductive material. For example, as illustrated in FIGS. 1A and 1B, FIGS. 2A and 2B, and FIGS. 3A and 3B, the first terminal may be formed using the same material as the first electrode. It is particularly preferable to use a material having higher conductance than the first electrode. For example, a material of the auxiliary wiring may be used. Specifically, silver, aluminum, copper, or the like can be used.

The second terminal 104 is formed using a conductive material. For example, as illustrated in FIGS. 1A and 1B, FIGS. 2A and 2B, and FIGS. 3A and 3B, the second terminal may be formed using the same material as the first electrode. It is particularly preferable to use a material having higher conductance than the first electrode. For example, a material of the auxiliary wiring may be used. Specifically, silver, aluminum, copper, or the like can be used.

For the partition wall 114, a material having an insulating property can be used. For example, a polyimide resin, an acrylic resin, or the like can be used, and as a formation method thereof, a screen printing method, a slit-coating method, or the like can be used. Further, an inorganic insulating material such as silicon oxide ($SiO_x$) can be used.

For the auxiliary wiring 111b, a material having higher conductance than the first electrode is used. Specifically, silver, aluminum, copper, or the like is preferable.

For the sealant 131, a material whose moisture permeability per length of 0.1 mm in a direction in which the light-emitting element is surrounded is less than 100 g/m$^2$/24 hr is desirable. For example, a frit paste including a low-melting-point glass or a curable resin (specifically, an epoxy-based resin or an acrylic-based resin) can be used. Note that in the case where the frit paste including a low-melting-point glass is used for the sealant 131, the low-melting-point glass is melted using a local heating apparatus (e.g., a device generating an energy beam, specifically a semiconductor laser), and the substrate and the counter substrate are welded to each other using the melted low-melting-point glass. As the curable resin, a thermally curable resin and a photocurable resin can be given as examples. The photocurable resin is preferable because it is cured in a short time and it is not necessary to expose the light-emitting element to a high temperature in curing. Specifically, an UV curable resin is desirable.

[Embodiment 2]

Figure 2A:
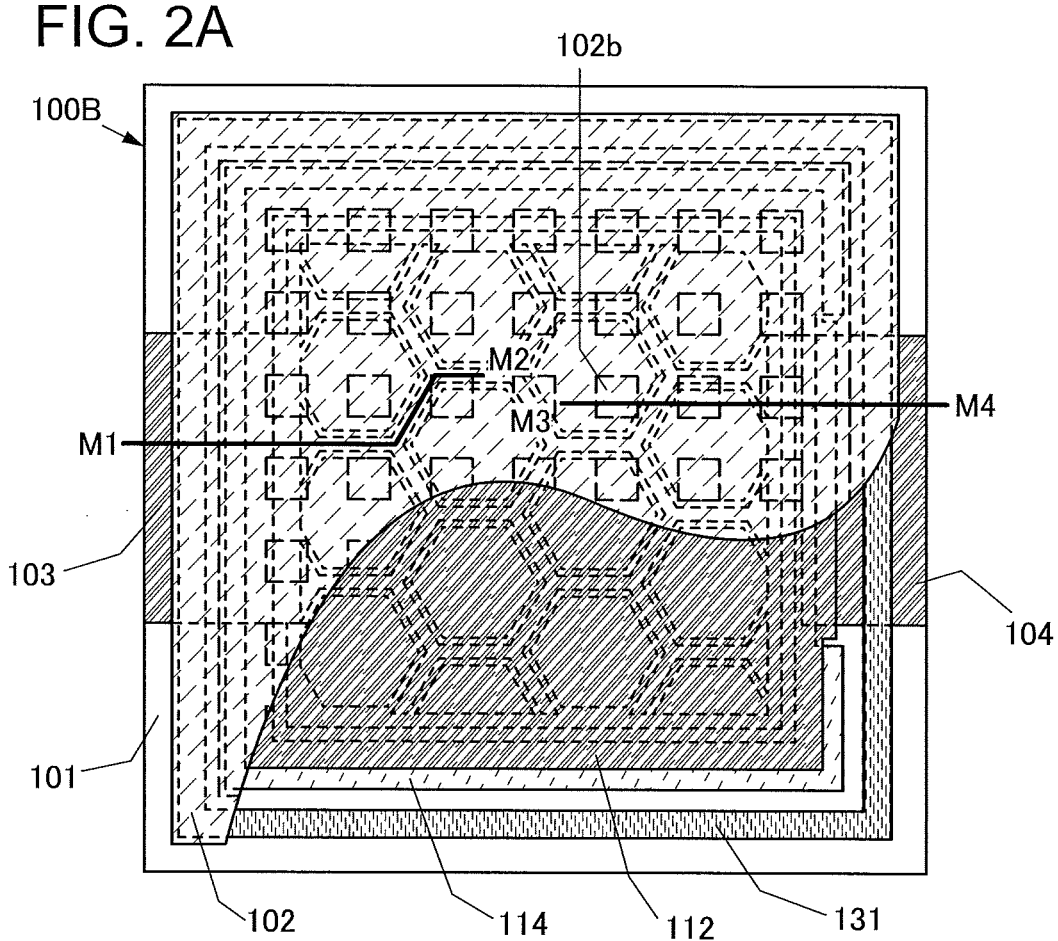
FIG. 2A is a plan view illustrating a light-emitting device 100B of one embodiment of the present invention.
Figure 2B:
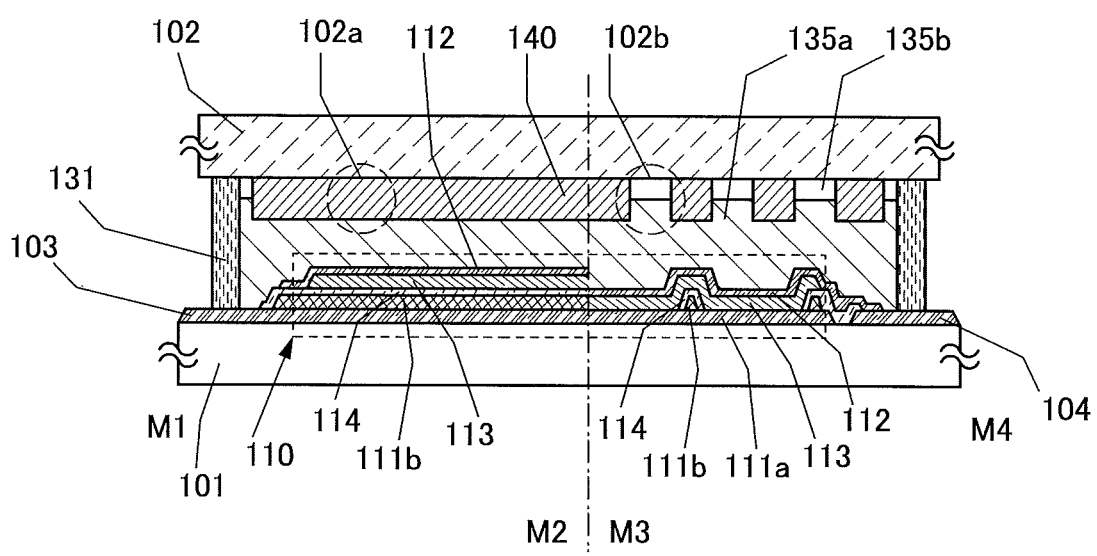
FIG. 2B is a cross-sectional view taken along line M1-M2 and line M3-M4 of FIG. 2A.

FIG. 2A is a plan view illustrating a light-emitting device 100B of one embodiment of the present invention, and FIG. 2B is a cross-sectional view taken along line M1-M2 and line M3-M4 of FIG. 2A. In FIGS. 2A and 2B, the same portions as those in FIGS. 1A and 1B are denoted by the same reference numerals and the description thereof is omitted.

A sheet-like member 140 is attached to a bottom surface of the counter substrate 102, and the sheet-like member 140 is provided with the plurality of depression structures 102b and the plurality of projection structures 102a. The sheet-like member 140 is provided with through-holes which are quadrilateral when seen from the above as the plurality of depression structures 102b (see FIG. 2A). The plurality of projection structures 102a are each formed between the plurality of depression structures 102b and are formed by formation of the plurality of depression structures 102b. Note that the sealant 131 is provided on the counter substrate 102 so as to surround the organic EL element 110 in an overlapping manner with the substrate 101, and the height of the sealant 131 from the counter substrate 102 is higher than those of the plurality of projection structures 102a. Further, the counter substrate 102 and the sheet-like member 140 preferably have high thermal conductivity.

For the sheet-like member 140, metal or a resin material can be used. Since the metal has high thermal conductance, a light-emitting device excellent in a heat dissipation property can be obtained. Further, the resin material is preferable because of excellent processability.

Advantageous effects similar to those of Embodiment 1 can also be obtained in this embodiment.

[Embodiment 3]

Figure 3A:
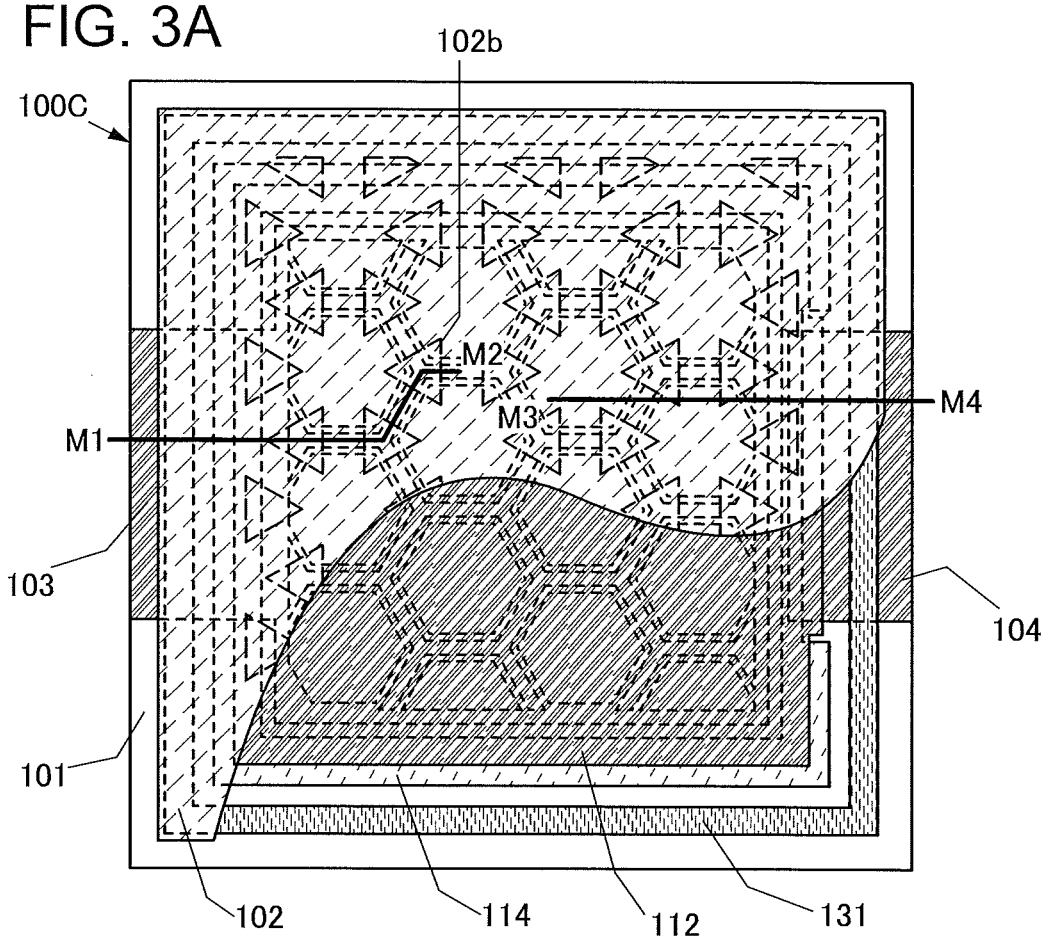
FIG. 3A is a plan view illustrating a light-emitting device 100C of one embodiment of the present invention.
Figure 3B:
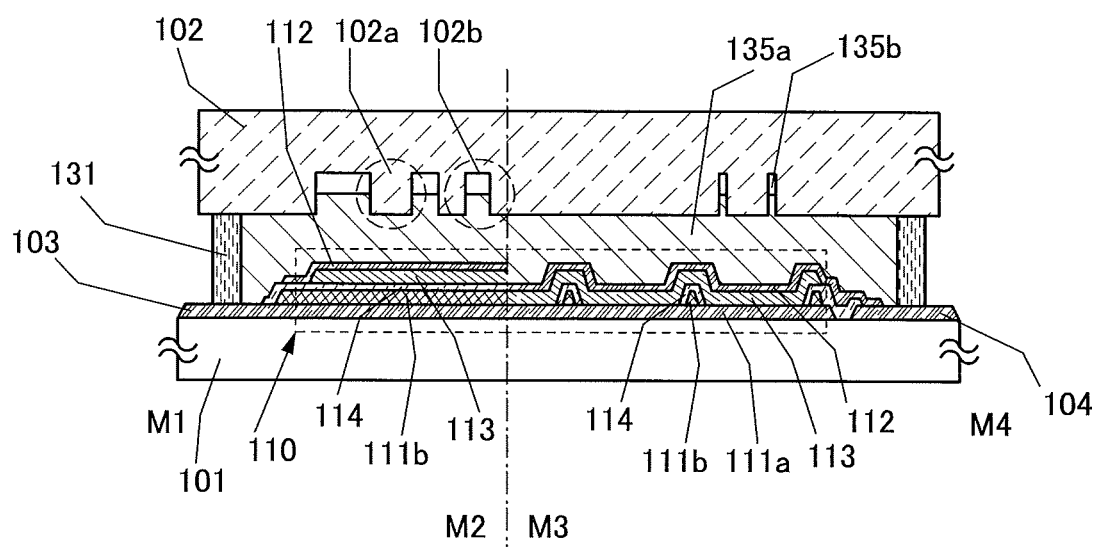
FIG. 3B is a cross-sectional view taken along line M1-M2 and line M3-M4 of FIG. 3A.

FIG. 3A is a plan view illustrating a light-emitting device 100C of one embodiment of the present invention, and FIG. 3B is a cross-sectional view taken along line M1-M2 and line M3-M4 of FIG. 3A. In FIGS. 3A and 3B, the same portions as those in FIGS. 1A and 1B are denoted by the same reference numerals and the description thereof is omitted.

The plurality of depression structures 102b and the plurality of projection structures 102a are formed on a bottom surface of the counter substrate 102, and the plurality of depression structures 102b are formed by providing a plurality of holes which are triangular when seen from the above on the bottom surface of the counter substrate 102 (see FIG. 3A).

Advantageous effects similar to those of Embodiment 1 can also be obtained in this embodiment.

[Embodiment 4]

Figure 4A:
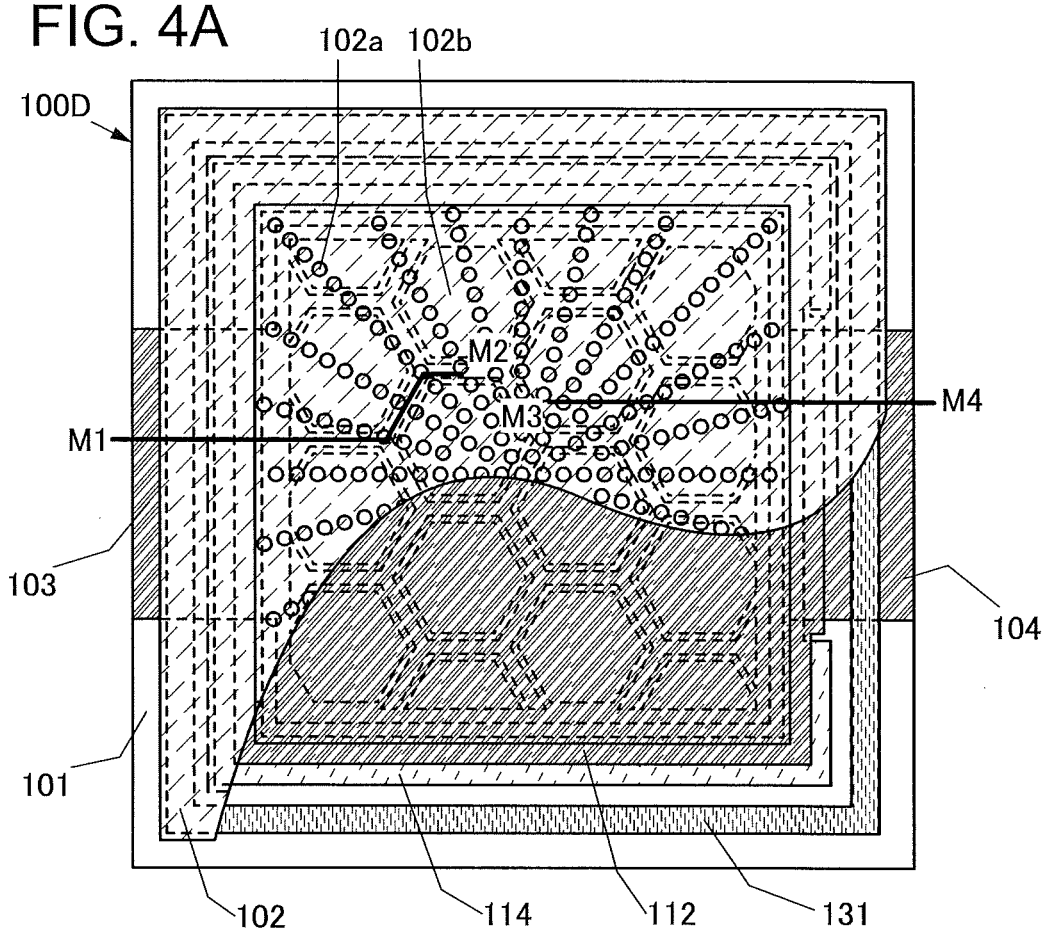
FIG. 4A is a plan view illustrating a light-emitting device 100D of one embodiment of the present invention.
Figure 4B:
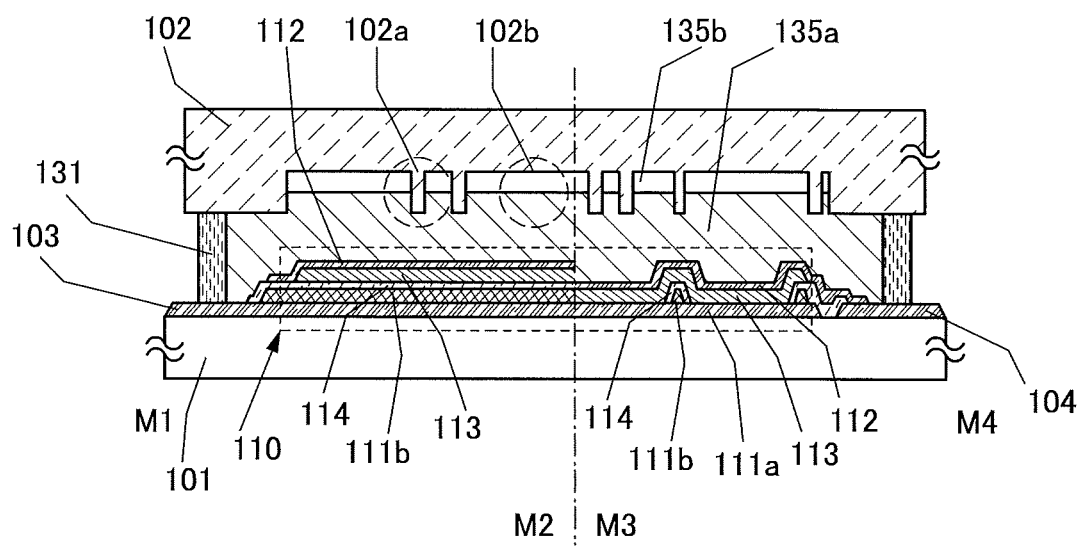
FIG. 4B is a cross-sectional view taken along line M1-M2 and line M3-M4 of FIG. 4A.

FIG. 4A is a plan view illustrating a light-emitting device 100D of one embodiment of the present invention, and FIG. 4B is a cross-sectional view taken along line M1-M2 and line M3-M4 of FIG. 4A. In FIGS. 4A and 4B, the same portions as those in FIGS. 1A and 1B are denoted by the same reference numerals and the description thereof is omitted.

The plurality of depression structures 102b and the plurality of projection structures 102a are formed on a bottom surface of the counter substrate 102, and the plurality of projection structures 102a are formed by providing a plurality of cylindrical structures on the bottom surface of the counter substrate 102 (see FIG. 4A).

The density of the plurality of projection structures 102a in a central portion of the bottom surface of the counter substrate 102 is made higher than the density of the plurality of projection structures 102a in the peripheral portion thereof. Accordingly, heat can be efficiently dissipated from the central portion where heat is likely to be accumulated because a contact area between the counter substrate 102 and the thermal conductor 135a gets larger.

Advantageous effects similar to those of Embodiment 1 can also be obtained in this embodiment.

[Embodiment 5]

Figure 5:
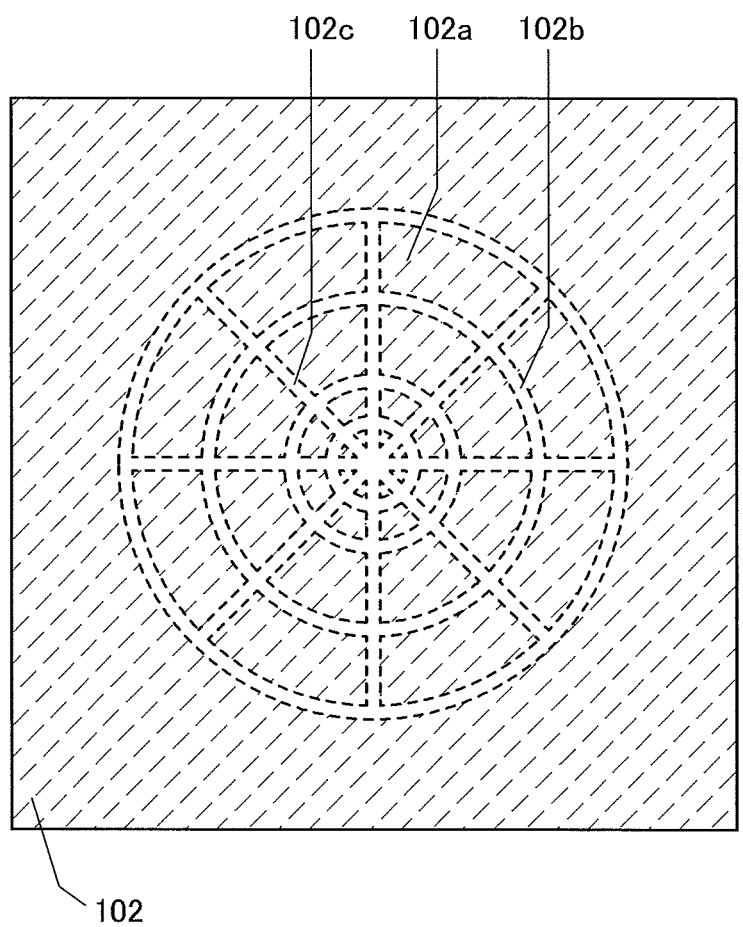
FIG. 5 is a plan view illustrating a plurality of projection structures, a plurality of depression structures, and a pathway for joining the plurality of depression structures which are formed on a bottom surface of a counter substrate of a light-emitting device of one embodiment of the present invention.

FIG. 5 is a plan view illustrating the plurality of projection structures 102a, the plurality of depression structures 102b, and a pathway 102c for joining the plurality of depression structures which are formed on a bottom surface of the counter substrate 102 of a light-emitting device of one embodiment of the present invention.

The plurality of depression structures 102b are formed by providing a plurality of depression pathways which are substantially circular when seen from the above on the bottom surface of the counter substrate 102. The pathway 102c for joining the plurality of depression structures are provided so that the plurality of depression structures 102b are joined to each other.

Note that other than the plurality of projection structures 102a, the plurality of depression structures 102b, and the pathway 102c for joining the plurality of depression structures in the light-emitting device in this embodiment are similar to those of the light-emitting device in Embodiment 4.

Advantageous effects similar to those of Embodiment 1 can also be obtained in this embodiment.

Further, with the pathway 102c for joining the plurality of depression structures, the amount of an inert gas with which the plurality of depression structures 102b are filled can be averaged. Therefore, it is possible to prevent obstruction of heat conduction, which is caused by heat accumulation at a particular place that occurs when a particular depression structure 102b is filled only with an inert gas. Accordingly, all of the depression structures 102b are uniformly filled with the thermal conductor and heat can be dissipated uniformly.

This application is based on Japanese Patent Application serial No. 2012-271152 filed with the Japan Patent Office on Dec. 12, 2012, the entire contents of which are hereby incorporated by reference.

What is claimed is:

1. A light-emitting device comprising:
   a substrate;
   an organic EL element over the substrate;
   a counter substrate over the organic EL element;
   a plurality of projection structures which are formed on a bottom surface of the counter substrate and which face the organic EL element; and
   a liquid between the substrate and the counter substrate,
   wherein the plurality of projection structures and the organic EL element are each in contact with the liquid,
   wherein the density of the plurality of projection structures in a central portion of the counter substrate is higher than the density of the plurality of projection structures in a peripheral portion of the counter substrate,
   wherein the plurality of projection structures in both the central portion and the peripheral portion of the counter substrate overlap with the organic EL element,
   wherein the plurality of projection structures are integrated with the counter substrate, and
   wherein the liquid comprises:
      a first liquid having a first specific gravity; and
      a second liquid having a second specific gravity lower than the first specific gravity,
   wherein the first liquid is more hydrophobic than the second liquid and the second liquid captures water, and
   wherein the first specific gravity of the first liquid is higher than a specific gravity of water.

2. The light-emitting device according to claim 1, further comprising an inert gas in contact with a depression provided between the plurality of projection structures.

3. The light-emitting device according to claim 1, wherein each distance between the plurality of projection structures is greater than or equal to 100 μm and less than or equal to 500 μm.

4. The light-emitting device according to claim 2, wherein the depression has structures formed by providing a plurality of depression pathways which are substantially circular when seen from above on the bottom surface of the counter substrate.

5. A light-emitting device comprising:
a substrate;
an organic EL element over the substrate;
a counter substrate over the organic EL element;
a plurality of projection structures which are formed on a bottom surface of the counter substrate and which face the organic EL element;
a sealant which is provided on the counter substrate; and
a liquid between the substrate and the counter substrate,
wherein the liquid is sealed between the substrate and the counter substrate by the sealant surrounding a periphery of the organic EL element,
wherein the organic EL element includes a layer containing a light-emitting organic compound, the layer overlapping the plurality of projection structures,
wherein the plurality of projection structures and the organic EL element are arranged spaced apart through the liquid, and are each in contact with the liquid,
wherein the sealant is provided on the plurality of projection structures which are integrated with the counter substrate, and
wherein the liquid comprises:
a first liquid having a first specific gravity; and
a second liquid having a second specific gravity lower than the first specific gravity,
wherein the first liquid is more hydrophobic than the second liquid and the second liquid captures water, and
wherein the first specific gravity of the first liquid is higher than a specific gravity of water.

6. The light-emitting device according to claim 5,
wherein the organic EL element and the liquid are sealed between the substrate and the counter substrate by the sealant, and
wherein a volume of the liquid is smaller than a capacity of a region surrounded with the substrate, the counter substrate, and the sealant.

7. A method for manufacturing a light-emitting device, the light-emitting device comprising:
a substrate;
an organic EL element over the substrate;
a counter substrate over the organic EL element;
a plurality of projection structures which are formed on a bottom surface of the counter substrate and which face the organic EL element; and
a liquid between the substrate and the counter substrate,
wherein the plurality of projection structures and the organic EL element are each in contact with the liquid,
wherein the density of the plurality of projection structures in a central portion of the counter substrate is higher than the density of the plurality of projection structures in a peripheral portion of the counter substrate,
wherein the plurality of projection structures in both the central portion and the peripheral portion of the counter substrate overlap with the organic EL element,
wherein the plurality of projection structures are integrated with the counter substrate, and
wherein the liquid comprises:
a first liquid having a first specific gravity; and
a second liquid having a second specific gravity lower than the first specific gravity,
wherein the first liquid is more hydrophobic than the second liquid and the second liquid captures water, and
wherein the first specific gravity of the first liquid is higher than a specific gravity of water,
the method comprising the steps of:
preparing the substrate over which the organic EL element is provided and the counter substrate having a plurality of depression structures and the plurality of projection structures;
disposing the substrate and the counter substrate so that the plurality of depression structures and the plurality of projection structures face the organic EL element, and the organic EL element, the plurality of depression structures, and the plurality of projection structures are covered with the liquid, and an inert gas; and
sealing the organic EL element, the liquid, and the inert gas between the substrate and the counter substrate by applying a pressure to the substrate and the counter substrate.

* * * * *